(12) United States Patent
Honke et al.

(10) Patent No.: US 8,859,387 B2
(45) Date of Patent: Oct. 14, 2014

(54) METHOD FOR MANUFACTURING SILICON CARBIDE SEMICONDUCTOR DEVICE

(71) Applicant: Sumitomo Electric Industries, Ltd., Osaka (JP)

(72) Inventors: Tsubasa Honke, Itami (JP); Shin Harasa, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 52 days.

(21) Appl. No.: 13/686,173

(22) Filed: Nov. 27, 2012

(65) Prior Publication Data

US 2013/0137198 A1    May 30, 2013

Related U.S. Application Data

(60) Provisional application No. 61/565,058, filed on Nov. 30, 2011.

(30) Foreign Application Priority Data

Nov. 30, 2011  (JP) .................................. 2011-261395

(51) Int. Cl.
*H01L 21/76* (2006.01)
*H01L 21/66* (2006.01)
*H01L 29/16* (2006.01)
*H01L 29/04* (2006.01)
*H01L 29/66* (2006.01)
*H01L 29/78* (2006.01)
*H01L 21/02* (2006.01)
*H01L 21/04* (2006.01)

(52) U.S. Cl.
CPC ........... *H01L 22/10* (2013.01); *H01L 21/02378* (2013.01); *H01L 21/0243* (2013.01); *H01L 21/02529* (2013.01); *H01L 22/12* (2013.01); *H01L 29/1608* (2013.01); *H01L 21/049* (2013.01); *H01L 29/045* (2013.01); *H01L 29/66068* (2013.01); *H01L 29/7802* (2013.01)
USPC ............................................. 438/413; 438/16

(58) Field of Classification Search
CPC ................... H01L 21/02378; H01L 21/02529; H01L 21/0243
USPC ........................ 438/16, 413, 981; 117/84–85
See application file for complete search history.

(56) References Cited

U.S. PATENT DOCUMENTS 5,727,008 A * 3/1998 Koga .......................... 372/43.01
2001/0048114 A1* 12/2001 Morita et al. ................. 257/103

(Continued)

FOREIGN PATENT DOCUMENTS

JP          3917154 B2      5/2007
JP          2007-318031 A   12/2007

(Continued)

*Primary Examiner* — Allen Parker
(74) *Attorney, Agent, or Firm* — Drinker Biddle & Reath LLP

(57) ABSTRACT

A method for manufacturing a silicon carbide semiconductor device includes the following steps. There is prepared a silicon carbide substrate having a first main surface and a second main surface. On the first main surface, an electrode is formed. The silicon carbide substrate has a hexagonal crystal structure. The first main surface has an off angle of ±8° or smaller relative to a {0001} plane. The first main surface has such a property that when irradiated with excitation light having energy equal to or greater than a band gap of silicon carbide, luminous regions in a wavelength range of 750 nm or greater are generated in the first main surface at a density of $1\times10^4$ cm$^{-2}$ or smaller. In this way, a yield of a silicon carbide semiconductor device can be improved.

6 Claims, 6 Drawing Sheets

(56) References Cited

U.S. PATENT DOCUMENTS

2009/0072243 A1* 3/2009 Suda et al. .................... 257/77
2010/0200866 A1  8/2010 Kitou et al.
2011/0204383 A1* 8/2011 Yamamoto et al. ............ 257/77
2011/0308449 A1* 12/2011 Katsuno et al. ................ 117/84

FOREIGN PATENT DOCUMENTS

| | | |
|---|---|---|
| JP | 2010184833 A | 8/2010 |
| JP | 2011-220744 A | 11/2011 |

* cited by examiner

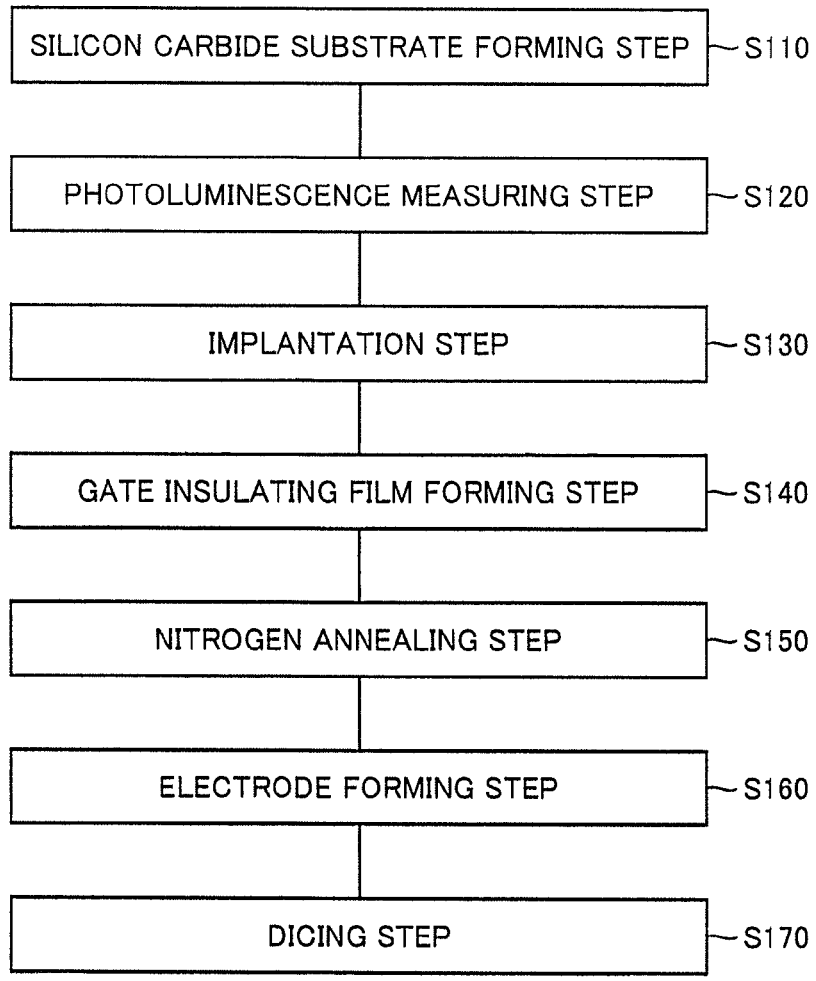
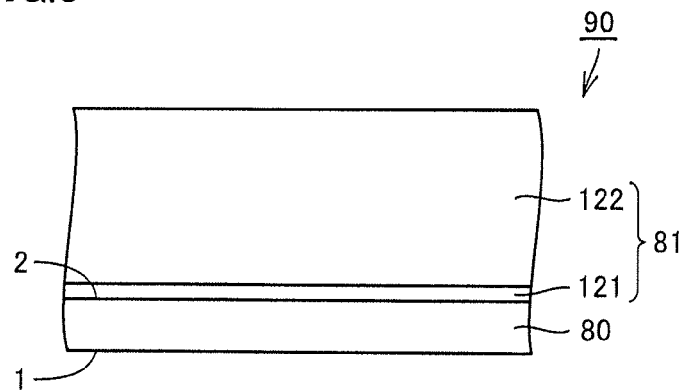

METHOD FOR MANUFACTURING SILICON CARBIDE SEMICONDUCTOR DEVICE

This application claims the benefit of U.S. Provisional Application No. 61/565,058 filed Nov. 30, 2011, which is incorporated by reference herein in the entirety.

BACKGROUND OF THE INVENTION

1. Field of the Invention

The present invention relates to a method for manufacturing a silicon carbide semiconductor device, more particularly, a method for manufacturing a silicon carbide semiconductor device employing a silicon carbide substrate having a hexagonal crystal structure.

2. Description of the Background Art

In recent years, a silicon carbide substrate has begun to be used to manufacture a semiconductor device. Silicon carbide has a band gap larger than that of silicon. Accordingly, a semiconductor device employing such a silicon carbide substrate has high breakdown voltage, low on-resistance, and a property less deteriorated under high temperature environment, advantageously.

In order to improve a yield of a semiconductor device employing the above-described silicon carbide substrate, it is required to control dislocations in the silicon carbide substrate. For example, Japanese Patent Laying-Open No. 2010-184833 discloses that deterioration of property of a device (semiconductor device) and decrease of yield thereof can be suppressed by forming an angle of 22.5° or smaller between the [0001] axis and a direction of dislocation line of threading dislocations that penetrates the (0001) plane.

In the method described in Japanese Patent Laying-Open No. 2010-184833, the density of dislocations is reduced by controlling the direction of the dislocation line in an epitaxial film formed on the silicon carbide substrate. However, with only the reduction of the density of dislocations in the epitaxial film, it is difficult to sufficiently improve the yield of the semiconductor device.

SUMMARY OF THE INVENTION

The present invention has been made to solve the foregoing problem and provide a method for manufacturing a semiconductor device so as to improve a yield of a semiconductor device.

As a result of the inventors' diligent research on a relation between the yield of the semiconductor device and the density of dislocations, the inventors have found that only the reduction of density of dislocations in the substrate's surface on which the epitaxial layer is formed (i.e., the front-side surface of the substrate) is not sufficient to improve the yield of the semiconductor device, and have found that in order to improve the yield of the semiconductor device, it is important to reduce the density of dislocations in the substrate's surface on which an electrode is formed (i.e., the backside surface of the substrate). The following describes a reason thereof.

There are two types of crystal defects in a silicon carbide substrate having a main surface corresponding to the {0001} plane. One is a crystal defect called "threading dislocation". This threading dislocation is a crystal defect growing a direction (<0001> direction) perpendicular to the growth plane of crystal. The other is a crystal defect called "stacking fault" or "basal plane dislocation", each of which is a crystal defect growing in a direction (<11-20> direction) parallel to the {0001} plane. In the case where a substrate having a main surface corresponding to the (0001) plane is obtained by slicing an ingot, there is substantially no difference between the density of threading dislocations in the front-side surface of the substrate and the density of threading dislocations in the backside surface thereof because the threading dislocations grow in the direction perpendicular to the main surface thereof. In contrast, the density of dislocations, such as the stacking faults or the basal plane dislocations, existing in the direction parallel to the (0001) plane may be different between the front-side surface and the backside surface of the substrate, unlike the case of the threading dislocations.

When the density of the dislocations in the backside surface is increased, the substrate will be changed in shape. Specifically, whenever the substrate is subjected to a process such as a thermal process or a film forming process, a SORI value, which indicates a magnitude of warpage of the substrate, will be changed. The change in SORI value of the substrate due to the thermal process or the like makes positional alignment difficult in a subsequent step such as lithography. This result in decreased yield of the semiconductor device fabricated using the substrate. In the case where the device forming process is performed using the substrate having its front-side surface having a low density of dislocations but having its backside surface having a high density of dislocations, the SORI value will be changed between the SORI value before the device forming process and the SORT value after the device forming process. When the amount of change in SORI value is large, the ratio of occurrence of positional misalignment (pattern misalignment) in the lithography step will be large, thus resulting in reduced yield of the semiconductor device. In other words, in order to improve the yield of the semiconductor device, it is required to reduce the amount of change in SORI value by reducing the density of dislocations in the backside surface of the substrate.

To achieve this, a method for manufacturing a silicon carbide semiconductor device in the present invention includes the following steps. There is prepared a silicon carbide substrate having a first main surface and a second main surface opposite to the first main surface. An electrode is formed on the first main surface. The silicon carbide substrate has a hexagonal crystal structure. The first main surface has an off angle of ±8° or smaller relative to a {0001} plane. The first main surface has such a property that when irradiated with excitation light having energy equal to or greater than a band gap of silicon carbide, luminous regions in a wavelength range of 750 nm or greater are generated in the first main surface at a density of $1\times10^4$ cm$^{-2}$ or smaller.

The density of the luminous regions in the wavelength range of 750 nm or greater is closely related to the density of dislocations. When the semiconductor device is manufactured using the silicon carbide substrate having such a property that the density of the luminous regions is $1\times10^4$ cm$^{-2}$ or smaller in the first main surface (backside surface), the amount of change in warpage of the substrate caused by a thermal process or the like can be reduced. As a result, positional misalignment takes place less frequently in the lithography step, thereby improving a yield of the semiconductor device.

Preferably, the method for manufacturing the silicon carbide semiconductor device further includes the step of forming an epitaxial layer on the second main surface. In this way, the epitaxial layer is formed on the front-side surface of the substrate.

Preferably in the method for manufacturing the silicon carbide semiconductor device, the step of preparing the silicon carbide substrate includes the step of measuring the density of the luminous regions in the wavelength range of 750 nm or greater in the first main surface while irradiating the first main surface with the excitation light having the energy equal to or greater than the band gap of silicon carbide. By measuring the density of the luminous regions in the wavelength range of 750 nm or greater in the first main surface, the density of dislocations in the backside surface of the substrate can be inspected.

Preferably in the method for manufacturing the silicon carbide semiconductor device, the first main surface has such a property that when irradiated with the excitation light having the energy equal to or greater than the band gap of silicon carbide, non-luminous regions in a wavelength range of 390 nm are generated in the first main surface at a density of $1 \times 10^4$ $cm^{-2}$ or smaller. Thus, the yield of the semiconductor device is further improved by using the silicon carbide substrate having a low density of dislocations related to the non-luminous regions in the wavelength range of 390 nm.

Preferably in the method for manufacturing the silicon carbide semiconductor device, the step of preparing the silicon carbide substrate includes the step of measuring the density of the non-luminous regions in the wavelength range of 390 nm in the first main surface, while irradiating the first main surface with the excitation light having the energy equal to or greater than the band gap of silicon carbide. Here, the density of the non-luminous regions is closely related to the density of dislocations. Accordingly, by measuring the density of the non-luminous regions in the wavelength range of 390 nm in the first main surface, the density of dislocations related to the non-luminous regions can be inspected in a more detailed manner.

According to the present invention, a yield of a semiconductor device can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a schematic flowchart of a method for manufacturing the semiconductor device in the second embodiment of the present invention.

FIG. 8 is a partial cross sectional view schematically showing a first step of the method for manufacturing the semiconductor device in the second embodiment of the present invention.

DESCRIPTION OF THE PREFERRED EMBODIMENTS

Figure 1:
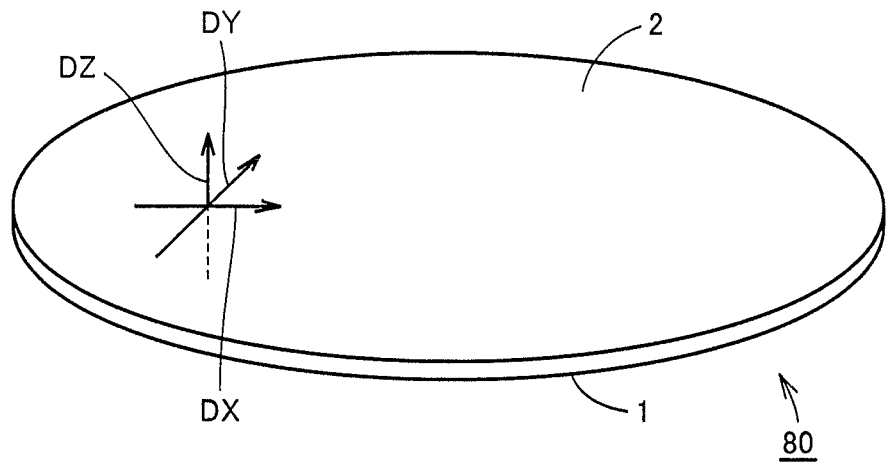
FIG. 1 is a perspective view schematically showing a configuration of a silicon carbide substrate in a first embodiment of the present invention.

The following describes embodiments of the present invention with reference to figures. It should be noted that in the below-mentioned figures, the same or corresponding portions are given the same reference characters and are not described repeatedly.

Regarding crystallographic indications in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

First Embodiment

As shown in FIG. 1, a silicon carbide substrate 80 in the present embodiment is a silicon carbide substrate 80 having a hexagonal crystal structure. Silicon carbide substrate 80 has a side surface, and has a first main surface 1 and a second main surface 2 both surrounded by the side surface. For ease of description, it is assumed that first main surface 1 is a backside surface and second main surface 2 is a front-side surface. The hexagonal crystal preferably has a polytype of 4H.

Figure 2:
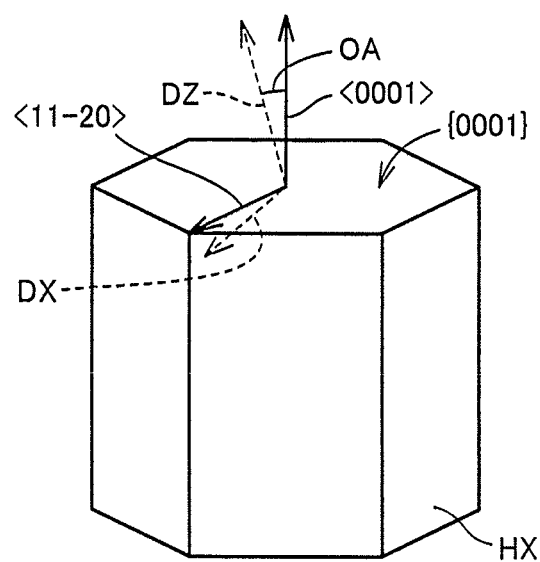
FIG. 2 is a perspective view showing an off angle of a crystal structure of the silicon carbide substrate in the first embodiment of the present invention.

Further, as shown in FIG. 2, first main surface 1 (FIG. 1) is inclined by an off angle OA relative to a {0001} plane of hexagonal crystal HX. In other words, first main surface 1 has a normal direction DZ inclined by off angle OA relative to a <0001> direction. Off angle OA of first main surface 1 relative to the {0001} plane is ±8° or smaller. This inclination is provided in an off direction DX, for example. In the figure, a direction DY is a direction perpendicular to direction DX in first main surface 1. Off direction DX is a <11-20> direction in the {0001} plane, for example.

First main surface 1 of silicon carbide substrate 80 has a specific photoluminescence property described below. The following describes measurement of this photoluminescence property and a device used for the measurement.

Figure 3:
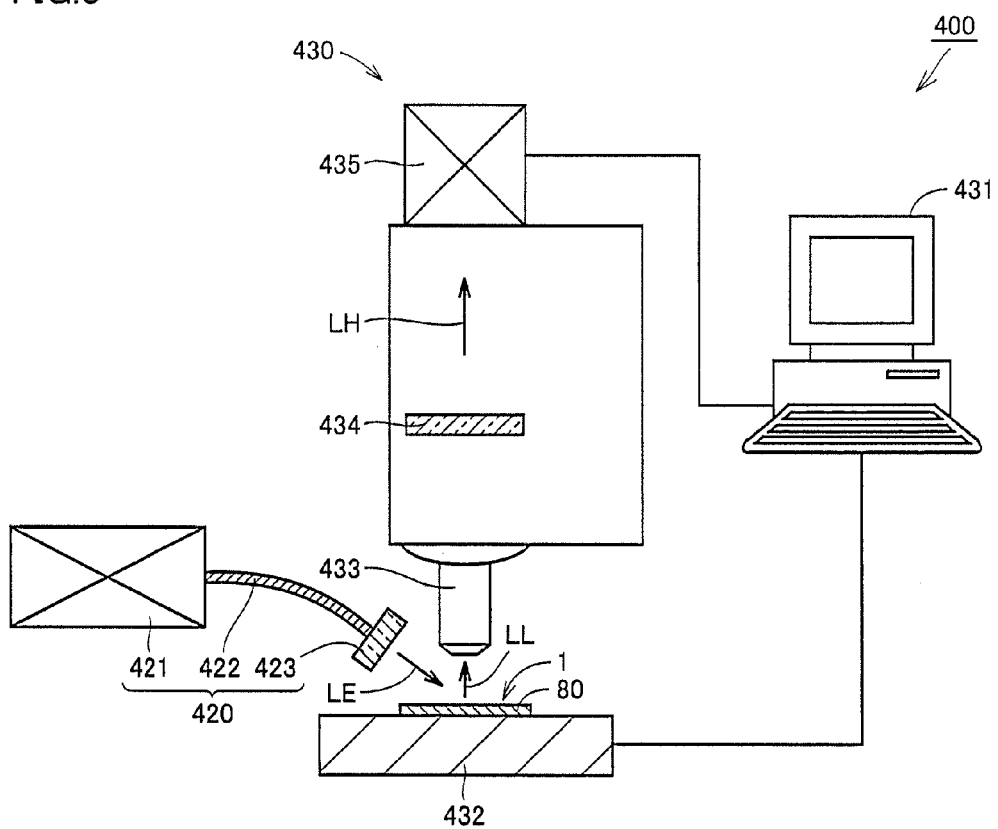
FIG. 3 is a block diagram schematically showing a configuration of a measuring device used for photoluminescence measurement of the silicon carbide substrate in the first embodiment of the present invention.

As shown in FIG. 3, a photoluminescence measuring device 400 has an excitation light generating unit 420 and a microscope unit 430.

Excitation light generating unit 420 has a light source unit 421, a light guide unit 422, and a filter 423. Light source unit 421 is a light source including an energy component higher than the band gap of the hexagonal silicon carbide. Light source unit 421 is a mercury lamp, for example. Light guide unit 422 guides light emitted from light source unit 421, and includes an optical fiber, for example. Filter 423 selectively permits passage of light having a specific wavelength corresponding to energy higher than the band gap of the hexagonal silicon carbide. Typically, the wavelength corresponding to the band gap of the hexagonal silicon carbide is approximately 313 nm. Hence, for example, a band-pass filter particularly permitting passage of light having a wavelength of approximately 390 nm can be used as filter 423. With this configuration, excitation light generating unit 420 can emit excitation light LE having energy higher than the band gap of the hexagonal silicon carbide.

Microscope unit 430 has a control unit 431, a stage 432, an optical system 433, a filter 434, and a camera 435. Control unit 431 controls displacement movement of stage 432, and controls an image capturing operation performed by camera 435. Control unit 431 is a personal computer, for example. Stage 432 supports silicon carbide substrate 80 so as to expose first main surface 1, and displaces the location of first main surface 1. Stage 432 is an XY stage, for example. Optical system 433 receives photoluminescence light LL emitted from first main surface 1 as a result of excitation caused by excitation light LE. Of the light received by optical system 433, filter 434 selectively permits passage of light having a wavelength of 750 nm or greater. Filter 434 is a low pass filter or a band-pass filter. Camera 435 captures an image resulting from transmission light LH having passed through filter 434, and sends data thereof to control unit 431. Camera 435 is a CCD camera, for example.

The following describes a method for measuring the photoluminescence.

First, excitation light LE enters first main surface 1 of silicon carbide substrate 80. The excitation light has energy equal to or greater than the band gap of the silicon carbide. Accordingly, luminous regions emitting photoluminescence light LL are generated on first main surface 1. Of photoluminescence light LL, transmission light LH having passed through filter 434 is observed as an image by camera 435. In the case where filter 434 is a filter which particularly permits passage of light having a frequency of, for example, 750 nm or greater, luminous regions emitting photoluminescence light LL having a wavelength of 750 nm or greater are observed on first main surface 1. In this case, a density of the luminous regions is closely related to a density of dislocations. Meanwhile, in the case where filter 434 is a filter which particularly permits passage of light in a wavelength range of, for example, around 390 nm, luminous regions emitting photoluminescence light LL having a wavelength of around 390 nm are observed on first main surface 1.

The following describes a property of silicon carbide substrate 80 according to the present embodiment.

First main surface 1 of silicon carbide substrate 80 in the present embodiment has such a property that when irradiated with excitation light LE having energy equal to or greater than the band gap of silicon carbide, luminous regions 3 in the wavelength range of 750 nm or greater are generated in first main surface 1 at a density of $1\times10^4$ cm$^{-2}$ or smaller. More preferably, luminous regions 3 in the wavelength range of 750 nm or greater are generated in first main surface 1 at a density of $1\times10^3$ cm$^{-2}$ or smaller.

Figure 4:
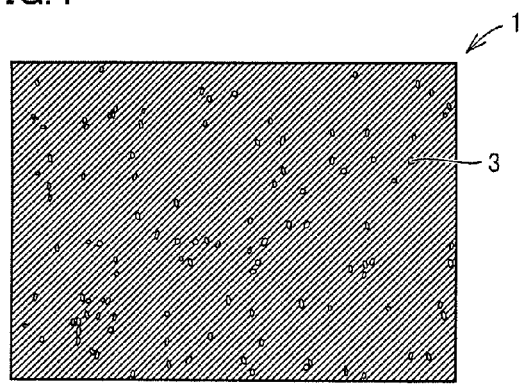
FIG. 4 is a partial plan view schematically showing exemplary luminous regions of the silicon carbide substrate in the first embodiment of the present invention.

Referring to FIG. 4, the following schematically describes luminous regions 3 in the wavelength range of 750 nm or greater in first main surface 1. When performing the above-described photoluminescence measurement, luminous regions 3 are observed as bright spots, in the image captured by camera 435. The density of luminous regions 3 is calculated as the number of bright spots per unit area. The density of luminous regions 3 is closely related to the density of dislocations. When the density of luminous regions 3 is low, the density of dislocations is also low.

First main surface 1 of silicon carbide substrate 80 in the present embodiment preferably has such a property that when irradiated with excitation light LE having energy equal to or greater than the band gap of silicon carbide, non-luminous regions 4 in the wavelength range of 390 nm are generated in first main surface 1 at a density of $1\times10^4$ cm$^{-2}$ or smaller. More preferably, non-luminous regions 4 in the wavelength range of 390 nm are generated in first main surface 1 at a density of $1\times10^3$ cm$^{-2}$ or smaller.

Figure 5:
FIG. 5 is a partial plan view schematically showing exemplary non-luminous regions of the silicon carbide substrate in the first embodiment of the present invention.

Referring to FIG. 5, the following schematically describes non-luminous regions 4 in the wavelength range of around 390 nm in first main surface 1. When performing the above-described photoluminescence measurement, non-luminous regions 4 are observed as dark spots in the image captured by camera 435. The density of non-luminous regions 4 is calculated by counting the number of dark spots per unit area. The density of non-luminous regions 4 is closely related to the density of dislocations. When the density of non-luminous regions 4 is low, the density of dislocations is also low.

The above description has illustrated the density of luminous regions 3 and the density of non-luminous regions 4 in the first main surface (backside surface) of silicon carbide substrate 80, but the density of luminous regions 3 and the density of non-luminous regions 4 in each of first main surface 1 and second main surface 2 may be low. Specifically, first main surface 1 (backside surface) of silicon carbide substrate 80 may have such a property that when irradiated with excitation light LE having energy equal to or greater than the band gap of silicon carbide, luminous regions 3 in the wavelength range of 750 nm or greater are generated in first main surface 1 at a density of $1\times10^4$ cm$^{-2}$ or smaller, and second main surface 2 (front-side surface) of silicon carbide substrate 80 may have such a property that when irradiated with excitation light LE having energy equal to or greater than the band gap of silicon carbide, luminous regions 3 in the wavelength range of 750 nm or greater are generated in second main surface 2 at a density of $1\times10^4$ cm$^{-2}$ or smaller. Likewise, first main surface 1 (backside surface) of silicon carbide substrate 80 may have such a property that when irradiated with excitation light LE having energy equal to or greater than the band gap of silicon carbide, non-luminous regions 4 in the wavelength range of 390 nm are generated in first main surface 1 at a density of $1\times10^4$ cm$^{-2}$ or smaller, and second main surface 2 (front-side surface) of silicon carbide substrate 80 may have such a property that when irradiated with excitation light LE having energy equal to or greater than the band gap of silicon carbide, non-luminous regions 4 in the wavelength range of 390 nm or greater are generated in second main surface 2 at a density of $1\times10^4$ cm$^{-2}$ or smaller.

When a difference is large between the dislocation density in first main surface 1 and the dislocation density in second main surface 2 of silicon carbide substrate 80, a SORI value is likely to be greatly changed between a SORI value before a thermal process or a film forming process and a SORI value after the thermal process or the film forming process. As described above, when the dislocation density in first main surface 1 and the dislocation density in second main surface 2 of silicon carbide substrate 80 are similarly low, the change in SORI value will be small.

Second Embodiment

Figure 6:
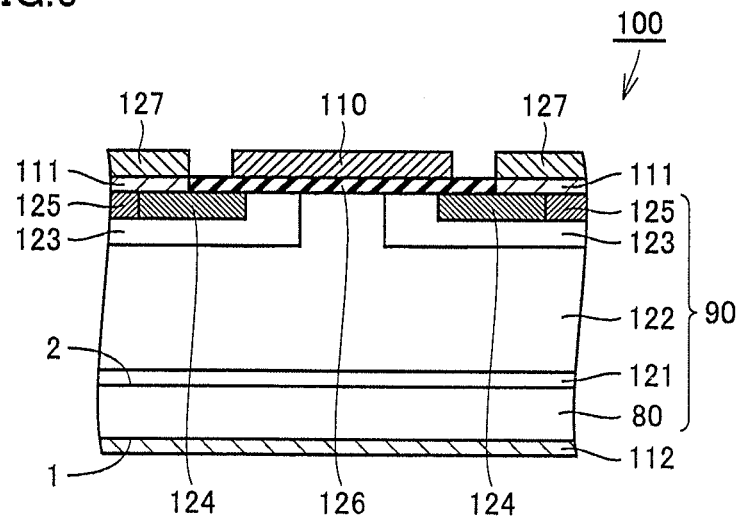
FIG. 6 is a schematic cross sectional view schematically showing a configuration of a semiconductor device in a second embodiment of the present invention.

As shown in FIG. 6, a silicon carbide semiconductor device 100 of the present embodiment is a MOSFET, specifically, a vertical type DiMOSFET (Double Implanted MOSFET). The MOSFET has an epitaxial substrate 90, an oxide film 126, source electrodes 111, upper source electrodes 127, a gate electrode 110, and a drain electrode. Epitaxial substrate 90 has a silicon carbide substrate 80, a buffer layer 121, a breakdown voltage holding layer 122, p regions 123, n+ regions 124, and p+ regions 125.

Silicon carbide substrate 80 is a substrate having the property described in the first embodiment. Each of silicon carbide substrate 80 and buffer layer 121 has n type conductivity. Buffer layer 121 contains an impurity of n type conductivity at a concentration of, for example, $5 \times 10^{17}$ cm$^{-3}$. Further, buffer layer 121 has a thickness of, for example, 0.5 μm.

Breakdown voltage holding layer 122 is formed on buffer layer 121, and is made of silicon carbide with n type conductivity. For example, breakdown voltage holding layer 122 has a thickness of 10 μm, and contains an impurity of n type conductivity at a concentration of $5 \times 10^{15}$ cm$^3$.

Breakdown voltage holding layer 122 has a surface in which the plurality of p regions 123 of p type conductivity are formed with a space therebetween. In each of p regions 123, an n+ region 124 is formed at the surface layer of p region 123. Further, at a location adjacent to n+ region 124, a p+ region 125 is formed. Oxide film 126 is formed on an exposed portion of breakdown voltage holding layer 122 between the plurality of p regions 123. Specifically, oxide film 126 is formed to extend on n+ region 124 in one p region 123, p region 123, the exposed portion of breakdown voltage holding layer 122 between the two p regions 123, the other p region 123, and n+ region 124 in the other p region 123. On oxide film 126, gate electrode 110 is formed. Further, source electrodes 111 are formed on n+ regions 124 and p+ regions 125. On source electrodes 111, upper source electrodes 127 are formed.

The following describes a method for manufacturing the MOSFET serving as silicon carbide semiconductor device 100.

Referring to FIG. 1, a silicon carbide substrate forming step (FIG. 7: S110) is performed. In the silicon carbide substrate forming step, silicon carbide substrate 80 is prepared which has first main surface 1 and second main surface 2 opposite to first main surface 1. Silicon carbide substrate 80 has the property described in the first embodiment.

Referring to FIG. 3, a photoluminescence measuring step (FIG. 7: S120) is performed. In the photoluminescence measuring step, while irradiating first main surface 1 with excitation light having energy equal to or greater than the band gap of silicon carbide, the density of luminous regions 3 in the wavelength range of 750 nm or greater is measured in the first main surface. Moreover, in the photoluminescence measuring step, while irradiating first main surface 1 with the excitation light having energy equal to or greater than the band gap of silicon carbide, the density of non-luminous regions 4 in the wavelength range of 390 nm is measured in first main surface 1. In the present embodiment, the density of luminous regions 3 and the density of non-luminous regions 4 are measured in first main surface 1. However, for example, the density of luminous regions 3 and the density of non-luminous regions 4 may be measured in each of first main surface 1 and second main surface 2.

Next, silicon carbide substrate 80 is subjected to screening based on the measured density of luminous regions 3 in the wavelength range of 750 nm or greater in first main surface 1. Specifically, when the density of luminous regions 3 in the wavelength range of 750 nm or greater is measured to be $1 \times 10^4$ cm$^{-2}$ or smaller in first main surface 1, silicon carbide substrate 80 is determined as a non-defective product. On the other hand, when the density of luminous regions 3 in the wavelength range of 750 nm or greater is measured to be greater than $1 \times 10^4$ cm$^{-2}$ in first main surface 1, silicon carbide substrate 80 is determined as a defective product. In this way, silicon carbide substrates 80 are screened into non-defective products and defective products. Using a silicon carbide substrate 80 determined as a non-defective product, silicon carbide semiconductor device 100 is manufactured.

Referring to FIG. 8, by means of epitaxial growth on second main surface 2 of silicon carbide substrate 80, an epitaxial layer 81 made of silicon carbide is formed. Specifically, buffer layer 121 is formed on the main surface of silicon carbide substrate 80, and then breakdown voltage holding layer 122 is formed on buffer layer 121. In this way, epitaxial substrate 90 is formed (FIG. 7: step S110). Buffer layer 121 is made of silicon carbide having n type conductivity, and has a thickness of, for example, 0.5 μm. Further, buffer layer 121 contains a conductive impurity at a concentration of, for example, $5 \times 10^{17}$ cm$^{-3}$. Breakdown voltage holding layer 122 has a thickness of, for example, 10 μm. Further, breakdown voltage holding layer 122 contains an impurity of n type conductivity at a concentration of, for example, $5 \times 10^{15}$ cm$^{-3}$.

Figure 9:
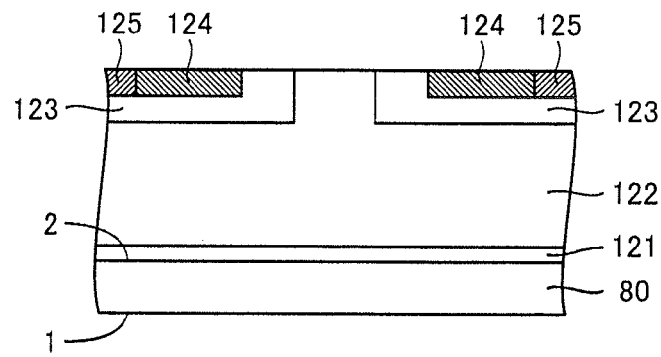
FIG. 9 is a partial cross sectional view schematically showing a second step of the method for manufacturing the semiconductor device in the second embodiment of the present invention.

As shown in FIG. 9, an implantation step (FIG. 7: step S130) is performed to form p regions 123, n+ regions 124, and p+ regions 125 as follows.

First, an impurity of p type conductivity is selectively implanted into portions of breakdown voltage holding layer 122, thereby forming p regions 123. Then, an impurity of n type conductivity is selectively implanted into predetermined regions to form n+ regions 124, and an impurity of p type conductivity is selectively implanted into predetermined regions to form p+ regions 125. It should be noted that such selective implantation of the impurities is performed using a mask formed of, for example, an oxide film.

After such an implantation step, an activation annealing process is performed. For example, the annealing is performed in argon atmosphere at a heating temperature of 1700° C. for 30 minutes.

Figure 10:
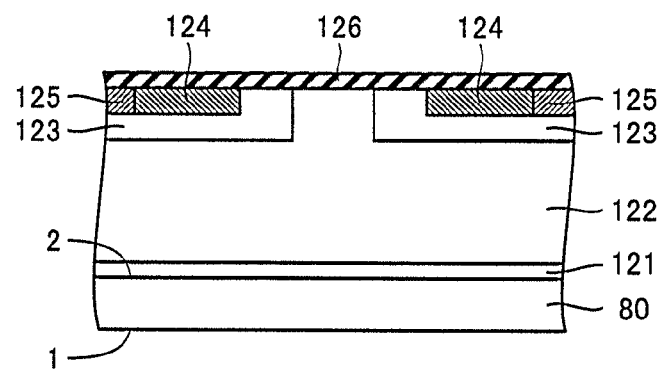
FIG. 10 is a partial cross sectional view schematically showing a third step of the method for manufacturing the semiconductor device in the second embodiment of the present invention.

As shown in FIG. 10, a gate insulating film forming step (FIG. 7: step S140) is performed. Specifically, oxide film 126 is formed to cover breakdown voltage holding layer 122, p regions 123, n+ regions 124, and p+ regions 125. Oxide film 126 may be formed through dry oxidation (thermal oxidation). Conditions for the dry oxidation are, for example, as follows: the heating temperature is 1200° C. and the heating time is 30 minutes.

Thereafter, a nitriding annealing step (FIG. 7: step S150) is performed. Specifically, an annealing process is performed in nitrogen monoxide (NO) atmosphere. Conditions for this process are, for example, as follows: the heating temperature is 1100° C. and the heating time is 120 minutes. As a result, nitrogen atoms are introduced into a vicinity of the interface between oxide film 126 and each of breakdown voltage holding layer 122, p regions 123, n+ regions 124, and p+ regions 125.

It should be noted that after the annealing step using nitrogen monoxide, an additional annealing process may be performed using argon (Ar) gas, which is an inert gas. Conditions for this process are, for example, as follows: the heating temperature is 1100° C. and the heating time is 60 minutes.

Figure 11:
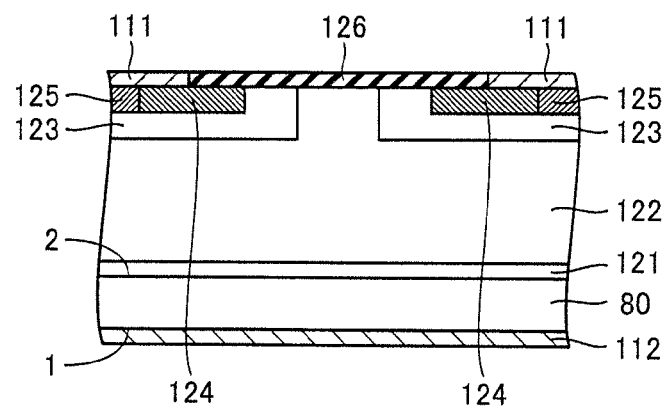
FIG. 11 is a partial cross sectional view schematically showing a fourth step of the method for manufacturing the semiconductor device in the second embodiment of the present invention.

As shown in FIG. 11, an electrode forming step (FIG. 7: step S160) is performed to form source electrodes 111 and electrode 112 in the following manner. It should be noted that in the present embodiment, electrode 112 is a drain electrode.

On oxide film 126, a resist film having a pattern is formed using a photolithography method. Using the resist film as a mask, portions above n+ regions 124 and p+ regions 125 in oxide film 126 are removed by etching. In this way, openings are formed in oxide film 126. Next, in each of the openings, a conductive film is formed in contact with each of n+ regions 124 and p+ regions 125. Then, the resist film is removed, thus removing (lifting off) the conductive film's portions located on the resist film. This conductive film may be a metal film, for example, may be made of nickel (Ni). As a result of the lift-off, source electrodes 111 are formed. Further, electrode 112 (drain electrode) is formed on first main surface 1 (backside surface) of silicon carbide substrate 80.

It should be noted that on this occasion, heat treatment for alloying is preferably performed. For example, the heat treatment is performed in atmosphere of argon (Ar) gas, which is an inert gas, at a heating temperature of 950° C. for two minutes.

Referring to FIG. 6 again, upper source electrodes 127 are formed on source electrodes 111. Further, gate electrode 110 is formed on oxide film 126.

Next, a dicing step (FIG. 7: step S170) is performed. In this way, a plurality of chips are obtained through cutting. In this way, a MOSFET (FIG. 6) serving as silicon carbide semiconductor device 100 is obtained.

It should be noted that a configuration can be employed in which conductivity types are opposite to those in the above-described configuration. Namely, a configuration can be employed in which p type and n type are replaced with each other. Further, the vertical type DiMOSFET has been exemplified, but another silicon carbide semiconductor device 100 may be manufactured using the combined substrate of the present invention. For example, a RESURF-JFET (Reduced Surface Field-Junction Field Effect Transistor) may be manufactured.

The following describes function and effect of the method for manufacturing silicon carbide semiconductor device 100 in the present embodiment.

According to the method for manufacturing silicon carbide semiconductor device 100 in the present embodiment, silicon carbide substrate 80 is employed in which first main surface 1 of silicon carbide substrate 80 has such a property that when irradiated with excitation light LE having energy equal to or greater than the band gap of silicon carbide, luminous regions 3 in a wavelength range of 750 nm or greater are generated in first main surface 1 at a density of $1\times10^4$ $cm^{-2}$ or smaller.

The density of luminous regions 3 in the wavelength range of 750 nm or greater is closely related to the density of dislocations. When silicon carbide semiconductor device 100 is manufactured using silicon carbide substrate 80 having such a property that the density of luminous regions 3 is $1\times10^4$ $cm^{-2}$ or smaller in first main surface 1, an amount of change in warpage of the substrate caused by a thermal process or the like can be reduced. As a result, positional misalignment takes place less frequently in a lithography step, thereby improving a yield of silicon carbide semiconductor device 100.

Further, in the manufacturing method according to the present embodiment, the step of preparing silicon carbide substrate 80 includes the step of measuring the density of luminous regions 3 in the wavelength range of 750 nm or greater in first main surface 1 while irradiating first main surface 1 with excitation light LE having energy equal to or greater than the band gap of silicon carbide. By measuring the density of luminous regions 3, the density of dislocations in the backside surface of the substrate can be inspected. In this way, non-defective silicon carbide substrate 80 can be selected to manufacture silicon carbide semiconductor device 100, thereby improving a yield of silicon carbide semiconductor device 100.

Further, in the case where first main surface 1 has such a property that when irradiated with excitation light LE having energy equal to or greater than the band gap of silicon carbide, non-luminous regions 4 in a wavelength range of 390 nm are generated in first main surface 1 at a density of $1\times10^4$ $cm^{-2}$ or smaller, the yield of silicon carbide semiconductor device 100 is further improved by using silicon carbide substrate 80 having a low density of dislocations related to non-luminous regions 4 in the wavelength range of 390 nm.

Further, in the case where there is employed the step of measuring the density of non-luminous regions 4 in the wavelength range of 390 nm in first main surface 1 while irradiating first main surface 1 with excitation light LE having energy equal to or greater than the band gap of silicon carbide, the density of dislocations related to non-luminous regions 4 can be inspected in a more detailed manner by measuring the density of non-luminous regions 4.

EXAMPLE

In Example, inspection was performed with regard to a density in the backside surface of a silicon carbide semiconductor substrate, as well as an amount of change in SORI value and a ratio of occurrence of pattern misalignment when performing a device process using the substrate. It should be noted that the SORI value refers to one index for quantifying a magnitude of warpage of the substrate. The SORT value is a value defined by a total of a distance from a least square plane of the main surface of the substrate to the highest point of the main surface of the substrate and a distance to the lowest point therefrom. It is meant that when the SORT value is large, the substrate has a large warpage.

The present invention's examples 1 to 5 and comparative examples 1 and 2 represent experimental wafers for measuring the ratio of occurrence of pattern misalignment. For the present invention's examples 1 to 5 and comparative examples 1 and 2, seven silicon carbide substrates 80 having different bright spot densities in first main surfaces (backside surfaces) were used. The bright spot density in each of the backside surfaces is shown in Table 1. In each of the present invention's examples 1 to 5, a silicon carbide substrate 80 having a bright spot density of 10000 or smaller was used. In each of comparative examples 1 and 2, a silicon carbide substrate 80 having a bright spot density of more than 10000 was used. Each of silicon carbide substrates 80 used in the present experiment has a second main surface 2 (front-side surface) having a low dislocation density. The front-side surfaces of the seven silicon carbide substrates 80 have similar dislocation densities.

The bright spot density in the backside surface of each of silicon carbide substrates 80 was measured using the method described in the first embodiment. As camera 435 for capturing the photoluminescence light, a CCD camera was used. The number of pixels in the CCD camera was 1024×1024 (96 dpi×96 dpi). A field of view for the measurement in one shot of the CCD camera was 650 μm×650 μm. The CCD camera had a spatial resolution of 0.6 μm/pixel.

TABLE 1

|  | Bright Spot Density [/cm$^2$] | Amount of Change in SORI Value [μm] | Ratio of Occurrence of Pattern Misalignment [%] |
|---|---|---|---|
| The Present Invention's Example 1 | 2321 | 2.2 | 4.2 |
| The Present Invention's Example 2 | 3040 | 2 | 4 |
| The Present Invention's Example 3 | 4869 | 3.6 | 4.9 |
| The Present Invention's Example 4 | 6124 | 2.9 | 4.7 |
| The Present Invention's Example 5 | 8483 | 4.3 | 6.1 |
| Comparative Example 1 | 11271 | 6.1 | 9.6 |
| Comparative Example 2 | 13633 | 9.3 | 12.3 |

Figure 12:
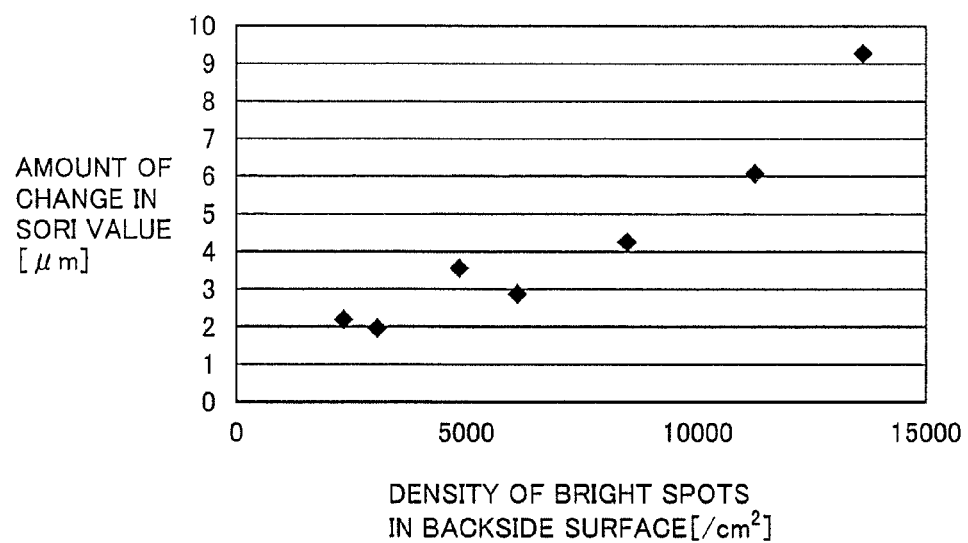
FIG. 12 shows a relation between a SORI value and a basal plane dislocation density in each semiconductor device in Example of the present invention.

Table 1 shows a relation among the bright spot density in first main surface 1 (backside surface) of each silicon carbide substrate 80, the amount of change in SORI value, and the ratio of occurrence of pattern misalignment. Meanwhile, FIG. 12 is a graph showing a relation between the bright spot density in the backside surface and the amount of change in SORI value. Here, the bright spot density can be considered as the dislocation density. The amount of change in SORT value refers to an amount of change between a SORI value before a thermal process or a film forming process and a SORI value after the thermal process or the film forming process as illustrated in the second embodiment. It is indicated that when the amount of change in SORI value is large, a change in warpage of the experimental wafer is large. The ratio of occurrence of pattern misalignment refers to a frequency of occurrence of pattern misalignment in the lithography step. When the ratio of occurrence of pattern misalignment is large, ion implantation or the like is not precisely performed to the semiconductor substrate, thus decreasing the yield of silicon carbide semiconductor device 100.

As understood from Table 1 and FIG. 12, the amount of change in SORT value in each of the experimental wafers of comparative examples 1 and 2 was large in value, i.e., 6.1 μm or greater. In addition, the ratio of occurrence of pattern misalignment therein was also large, i.e., 9.6% or greater. In contrast, the amount of change in SORI value in each of the experimental wafers of the present invention's example 1-5 was relatively small in value, i.e., 4.3 μm or smaller. Also, the ratio of occurrence of pattern misalignment therein was small, i.e., 6.1% or smaller.

From the experiment above, it was confirmed that the ratio of occurrence of pattern misalignment becomes low in the case of using silicon carbide substrate 80 having the backside surface having a bright spot density of 10000 or smaller.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device comprising the steps of:
    preparing a silicon carbide substrate having a first main surface and a second main surface opposite to said first main surface; and
    forming an electrode on said first main surface,
    said silicon carbide substrate having a hexagonal crystal structure,
    said first main surface having an off angle of ±8° or smaller relative to a {0001} plane,
    said first main surface having such a property that when irradiated with excitation light having energy equal to or greater than a band gap of silicon carbide, luminous regions in a wavelength range of 750 nm or greater are generated in said first main surface at a density of $1\times10^4$ cm$^{-2}$ or smaller,
    wherein the step of preparing said silicon carbide substrate includes a step of measuring the density of said luminous regions in the wavelength range of 750 nm or greater in said first main surface while irradiating said first main surface with the excitation light having the energy equal to or greater than the band gap of silicon carbide.

2. The method for manufacturing the silicon carbide semiconductor device according to claim 1, further comprising a step of forming an epitaxial layer on said second main surface.

3. The method for manufacturing the silicon carbide semiconductor device according to claim 1, wherein said first main surface has such a property that when irradiated with the excitation light having the energy equal to or greater than the band gap of silicon carbide, non-luminous regions in a wavelength range of 390 nm are generated in said first main surface at a density of $1\times10^4$ cm$^{-2}$ or smaller.

4. A method for manufacturing a silicon carbide semiconductor device comprising the steps of:
    preparing a silicon carbide substrate having a first main surface and a second main surface opposite to said first main surface; and
    forming an electrode on said first main surface,
    said silicon carbide substrate having a hexagonal crystal structure,
    said first main surface having an off angle of ±8° or smaller relative to a {0001} plane,
    said first main surface having such a property that when irradiated with excitation light having energy equal to or greater than a band gap of silicon carbide, luminous regions in a wavelength range of 750 nm or greater are generated in said first main surface at a density of $1\times10^4$ cm$^{-2}$ or smaller,
    wherein the step of preparing said silicon carbide substrate includes a step of measuring the density of said non-luminous regions in the wavelength range of 390 nm in said first main surface, while irradiating said first main surface with the excitation light having the energy equal to or greater than the band gap of silicon carbide.

5. The method for manufacturing the silicon carbide semiconductor device according to claim 4, further comprising a step of forming an epitaxial layer on said second main surface.

6. The method for manufacturing the silicon carbide semiconductor device according to claim 4, wherein said first main surface has such a property that when irradiated with the excitation light having the energy equal to or greater than the band gap of silicon carbide, non-luminous regions in a wavelength range of 390 nm are generated in said first main surface at a density of $1\times10^4$ cm$^{-2}$ or smaller.

* * * * *